(12) United States Patent
Cheah et al.

(10) Patent No.: US 11,430,764 B2
(45) Date of Patent: Aug. 30, 2022

(54) OVERHANG BRIDGE INTERCONNECT

(71) Applicant: Intel Corporation, Santa Clara, CA (US)

(72) Inventors: Bok Eng Cheah, Bukit Gambir (MY); Seok Ling Lim, Kulim (MY); Jenny Shio Yin Ong, Bayan Lepas (MY); Jackson Chung Peng Kong, Tanjung Tokong (MY); Kooi Chi Ooi, Glugor (MY)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 17/024,056

(22) Filed: Sep. 17, 2020

(65) Prior Publication Data
US 2021/0193616 A1 Jun. 24, 2021

(30) Foreign Application Priority Data
Dec. 20, 2019 (MY) .............................. PI2019007652

(51) Int. Cl.
*H01L 25/065* (2006.01)
*H01L 23/538* (2006.01)
*H01L 23/66* (2006.01)

(52) U.S. Cl.
CPC ...... *H01L 25/0652* (2013.01); *H01L 23/5381* (2013.01); *H01L 23/5384* (2013.01); *H01L 23/5386* (2013.01); *H01L 23/66* (2013.01); *H01L 2223/6677* (2013.01); *H01L 2225/06513* (2013.01)

(58) Field of Classification Search
CPC . H01L 25/0652; H01L 25/16; H01L 23/5381; H01L 23/5384; H01L 23/5386; H01L 23/66; H01L 2223/6677; H01L 2225/06513
USPC ........................................................ 257/668
See application file for complete search history.

(56) References Cited

U.S. PATENT DOCUMENTS

| | | | |
|---|---|---|---|
| 9,780,072 B2 * | 10/2017 | Jeng ........................ H01L 24/81 |
| 10,283,434 B2 * | 5/2019 | Sakai ................... H01L 25/0655 |
| 11,081,453 B2 * | 8/2021 | Liu ........................ H01Q 9/065 |
| 2009/0321939 A1 * | 12/2009 | Chandrasekaran ......................... H01L 25/0655 257/758 |
| 2013/0099006 A1 * | 4/2013 | Hong .................... H01Q 1/2283 235/492 |
| 2015/0171015 A1 * | 6/2015 | Mahajan ............... H01L 21/568 257/712 |
| 2017/0330835 A1 * | 11/2017 | Deshpande ............. H01L 23/13 |
| 2020/0212006 A1 * | 7/2020 | Chang ..................... H01L 25/50 |
| 2020/0294889 A1 * | 9/2020 | Choi ......................... H01G 4/33 |

(Continued)

*Primary Examiner* — Dao H Nguyen
(74) *Attorney, Agent, or Firm* — Schwegman Lundberg & Woessner, P.A.

(57) ABSTRACT

An electronic device and associated methods are disclosed. In one example, the electronic device includes a semiconductor article having a package substrate, a first semiconductor die coupled to the package substrate, a second semiconductor die coupled to the package substrate and adjacent the first semiconductor die, and a bridge component therebetween coupling the first semiconductor die to the second semiconductor die. The bridge component can include a bridge substrate, a conductive trace therein, and a passive component coupled to the conductive trace.

17 Claims, 6 Drawing Sheets

(56) References Cited

U.S. PATENT DOCUMENTS

2020/0294921 A1* 9/2020 Liu .................... H01L 25/0655
2021/0193577 A1* 6/2021 Lin .................... H01L 23/3128

* cited by examiner

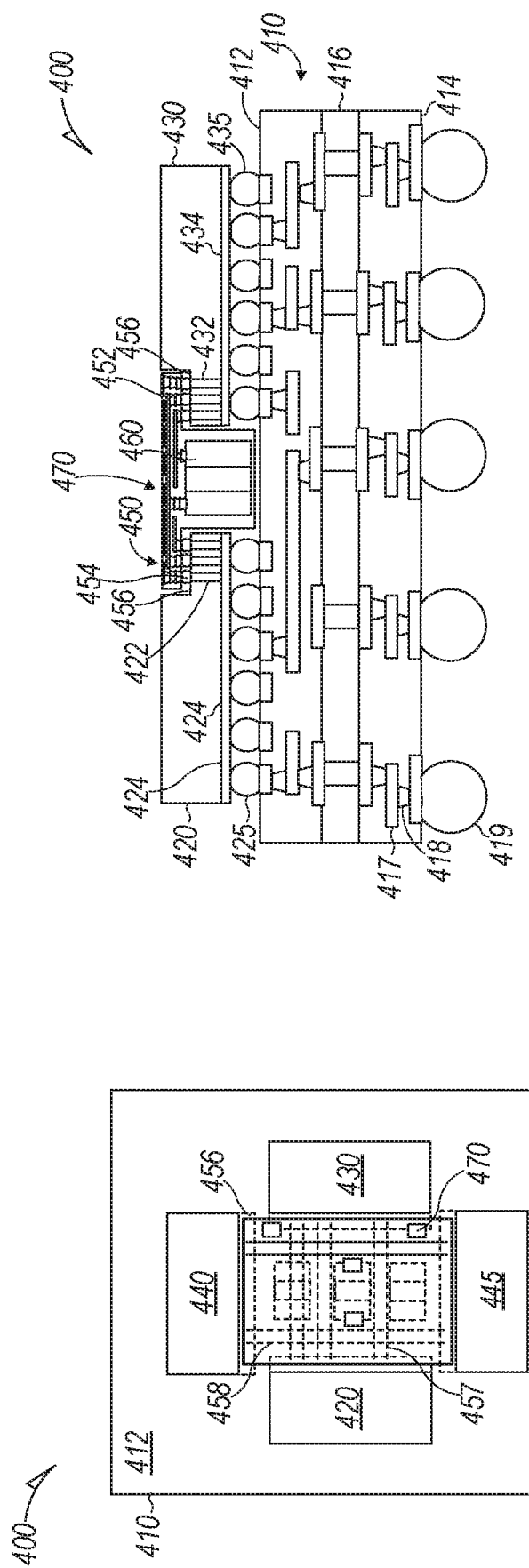

OVERHANG BRIDGE INTERCONNECT

This application claims the benefit of priority to Malaysian Application Serial No. PI2019007652, filed Dec. 20, 2019, which is incorporated herein by reference in its entirety.

TECHNICAL FIELD

Embodiments described herein generally relate to semiconductor packaging interconnects.

BACKGROUND

Semiconductor packaging can be subject to loop inductance between power delivery network and silicon devices. It is desired to have interconnects that address undesired loop inductance to improve signaling performance, and other technical challenges.

BRIEF DESCRIPTION OF THE DRAWINGS

FIGS. 4A-4B show schematic diagrams illustrating an example stacked semiconductor die package with an overhang bridge component in an antenna configuration.

DESCRIPTION OF EMBODIMENTS

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Power integrity challenges can be present where multiple semiconductor dies are used in a semiconductor package. For example, die-to-die data transmission bandwidth within a multi-chip or a 3-D stacked dies assembly can create power integrity impairment or power supply noise induced jitters (PSIJ). This can be due to, for example, undesired loop inductance between the power delivery network, such as decoupling capacitors and silicon circuitry.

Disclosed herein are a semiconductor package architecture and associated methods that include a bridge component. The bridge component can be used to couple multiple semiconductor dies on a package, such as vertically stacked semiconductor dies, while conserving space (e.g., an x-y footprint) in the package. Additionally, passive components, such as decoupling capacitors, can be mounted on the bridge component in die gaps, instead of on the package or circuit board surface.

The semiconductor package architecture and methods disclosed herein can, for example, allow for improved system power integrity performance by reduced loop inductance between power delivery decoupling components and silicon devices.

Additionally, the semiconductor package architecture and methods disclosed herein can allow for device miniaturization by avoiding additional silicon interposers or package substrate footprint trade off because of contact pads used for passive component attachment. The semiconductor package architecture and methods disclosed herein can also, for example, allow for improved signal latency and electrical signaling performance. For example, reduced conductor loss and reduced cross-talk coupling with smaller form-factor packages can occur.

Figure 1B:
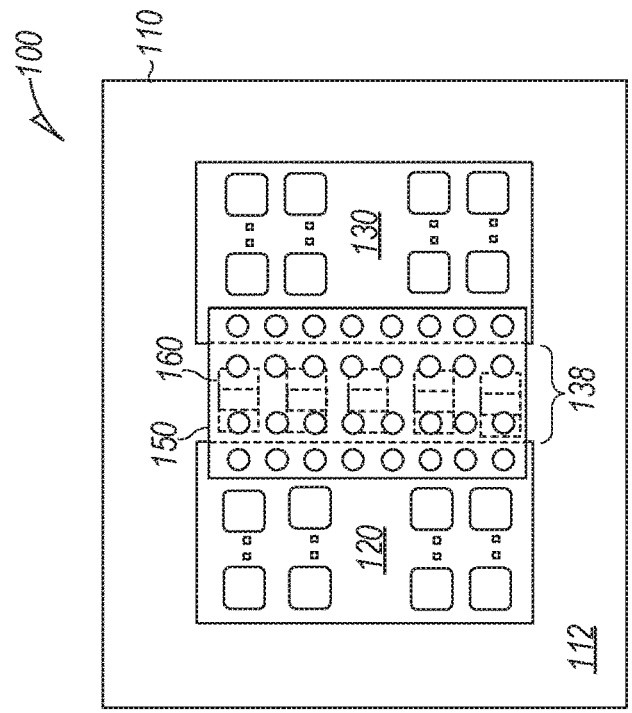
FIGS. 1A-1B show schematic diagrams illustrating an example stacked semiconductor die package with an overhang bridge component.
Figure 1A:
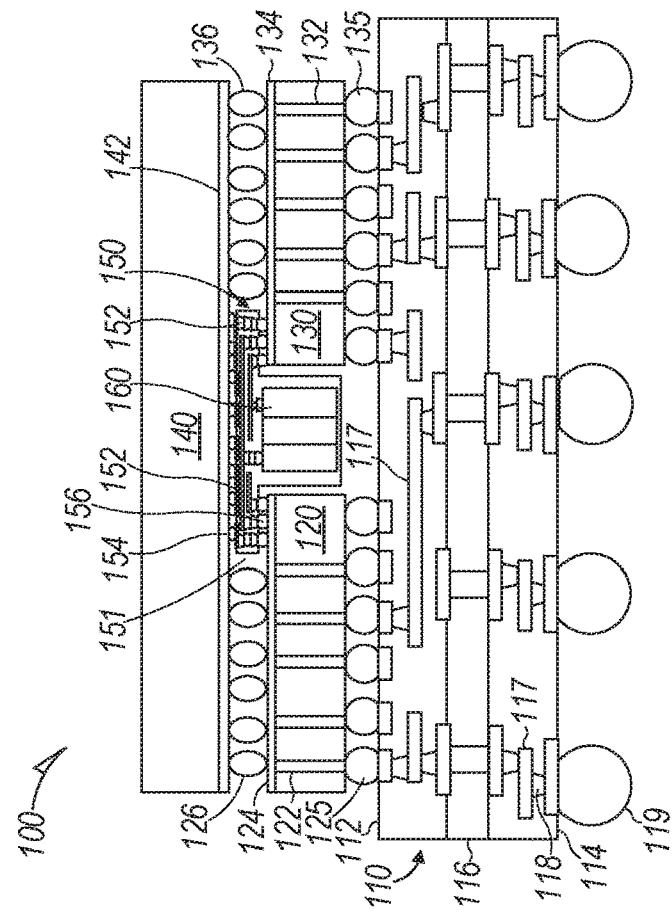

FIGS. 1A-1B show schematic diagrams illustrating an example semiconductor package 10 including stacked dies with an overhang bridge component 150. FIG. 1A shows a cross-sectional schematic view of package 100, while FIG. 1B shows a top-down schematic view of package 100.

Package 100 can include package substrate 110, with first surface 112, second surface 114, core layer 116, trace 117, via 118, and solder balls 119; first semiconductor die 120 with via 122, active layer 124, and solder bumps 125, 126; second semiconductor die 130 with via 132, active layer 134, and solder bumps 135, 136; die gap 138; and third semiconductor die 140 with active layer 142; bridge component 150 with interconnects 152, and micro bumps 154, 156, and capacitor 160.

In package 100, package substrate 110 host and supports semiconductor dies 120, 130, 140. Semiconductor dies 120, 130, 140, are electrically coupled to each other and other components on or connected to package substrate 110 through bridge component 150. Third semiconductor die 140 can be stacked on top of first and second semiconductor dies 120, 130, through support of bridge component 150. Capacitor 160 resides on and is coupled to bridge component 150.

Package substrate 110 can be, for example, a semiconductor package substrate hosting one or more semiconductor dies such as die 120, 130, 140. Package substrate 110 can have first side 112 opposite second side 114, separated by a dielectric or core layer 116. Package substrate 110 can be connected to semiconductor dies 120, 130, 140 through conductive via, traces, or other conductive connectors. In other arrangements, package substrate 110 can be a coreless substrate, such as a package substrate without a core layer 116. Trace 117, via 118, or other pads, can allow for electrical connection from semiconductor dies 120, 130, 140, through package substrate 110 to each other, to a circuit board, to other components mounted on the circuit board, or combinations thereof.

Solder balls 119 can connect semiconductor package 100 to a circuit board or other semiconductor component. Solder balls 119 can reside on second side 114 of package substrate 110. Solder balls 119 can be, for example, a ball grid array (BGA) made of conductive solder in an appropriate pattern to create electrical connections. Solder balls 119 can be connected to trace 117 in package substrate 110 via conductive pads or via 118 made of a conductive material. The BGA can be underfilled with an appropriate adhesive, such as, for example, epoxy or another adhesive as known in the art.

Semiconductor dies 120, 130, 140, can be mounted on package substrate 110. In semiconductor package 10, third semiconductor die 140 can be stacked or mounted vertically on top of first and second semiconductor dies 120, 130. Dies 120, 130, 140 can be, for example, a central processing unit (CPU), a platform controller hub/chipset die (PCH), a graphic processing unit (GPU), a memory die, a field programmable gate array (FGPA) or another semiconductor die. Semiconductor dies 120, 130 can be coupled to first side 112 of package substrate 110 through a plurality of solder bumps or other interconnects. Third semiconductor die 140 can be coupled to bridge component 150 through micro bumps 154. Third semiconductor die 140 can be coupled to semiconductor dies 120, 130, through bridge component 150, solder bumps 126, 136, other connectors, or combinations thereof.

First semiconductor die 120 can include via 122, active layer 124, and solder bumps 126 for creating an electrical connection from package substrate 110 to third semiconductor die 140. Likewise, second semiconductor die 130 can include via 132, active layer 134, and solder bumps 136.

Via 122, 132, can be, for example, through silicon via (TSV) or other conductive vertical channels. Via 122, 132, can run, for example, from solder bumps 125, 135 on landside first surface 112 of package substrate 110 to active layer 124, 134, which can be coupled to third semiconductor die 140 through solder bumps 126, 136.

Active layers 124, 134 can be conductive layers, such as metallic or composite layers, on surfaces of semiconductor dies 120, 130, respectively. The surfaces can be, for example, opposite package substrate 110. Active layers 124, 134, can be thin, deposited layers of conductive material allowing for electrical coupling through those layers. Active layers 124, 134 can include active components, for example, a plurality of transistor devices.

Solder bumps 126, 136, can be, for example, bump arrays made of conductive solder in an appropriate pattern to create electrical connections. Solder bumps can be connected via solder bump pads, made of a conductive and/or metallic material, such as copper. The solder bump pitch between two adjacent bumps can be, for example, about 30 micro-meter (μm) to about 80 μm. The solder bump arrays can be underfilled with an appropriate adhesive, such as, for example, epoxy or another adhesive as known in the art.

First and second semiconductor dies 120, 130, can be spaced slightly apart and connected through bridge component 150. Bridge component 150 can span between first and second semiconductor dies 120, 130. Third semiconductor die 140 can be vertically stacked on top of first semiconductor die 120, second semiconductor die 130, and bridge component 150.

Between first semiconductor die 120 and second semiconductor die 130 is die gap 138, seen in FIG. 1B. Die gap 138 is physical space between first and second semiconductor dies 120, 130. Die gap 138 can allow for space for one or more passive components to reside on bridge component 150. The one or more passive components can be mounted to the downside of the bridge component 150 can reside in the die gap 138, opposite third semiconductor die 140.

Third semiconductor die 140 can be, for example, a memory die. Third semiconductor die 140 can be vertically stacked over first semiconductor die 120 and second semiconductor die 130 so that third semiconductor die 140 creates a footprint partially or fully encompassing the first and second semiconductor dies 120, 130. Active layer 142 can allow for electrical coupling of third semiconductor die to first and second semiconductor dies 120, 130, through bridge component 150 and solder bumps 126, 136.

Bridge component 150 can hang between first, second, and third semiconductor dies 120, 130, 140. Bridge component 150 can electrically couple third die 140 to device 160. Bridge component 150 can include, for example, a substrate 151, interconnects 152, and micro bumps 154, 156.

Substrate 151 can be, for example, an organic, silicon, or glass-based substrate having a first surface and an opposing second surface. Interconnects 152 in and on substrate 151 can include, for example, a conductive layer, contact pads, conductive traces, or combinations thereof. The conductive layer in bridge component 150 can include, for example, reference planes, such as a ground reference plane ($V_{ss}$) or a power reference plane ($V_{CC}$). The active layers 124, 134, 144, of semiconductor dies 120, 130, 140, can be coupled to each other through interconnects 152 of bridge component 150. Micro bumps 154, 156 can electrically couple bridge component 150 to semiconductors dies 120, 130, 140 through the first and second surfaces.

Capacitor 160 can be, for example, mounted on the first surface of bridge substrate 151. Capacitor 160 can be, for example, a decoupling capacitor having first and second terminal. Each terminal of capacitor 160 can be, for example, associated with a reference voltage.

In one example reference capacitor, the first terminal can be coupled to a first conductive segment associated to a first reference voltage, such as a ground reference voltage (Vss). In that example, the second terminal can be coupled to a second conductive segment associated to a second reference voltage, such as a power reference voltage (Vcc). The ground reference voltage (Vss) and power reference voltage (Vcc) can, for example, come from a circuit board through package substrate 110, semiconductor dies 120, 130, various interconnects, solder balls, contact pads, via, or combinations thereof. For example, capacitor 160 can be coupled to ground (Vss) and power (Vcc) planes.

In an example, capacitor 160 can be a multi-layer ceramic capacitor (MLCC). In some examples, capacitor 160 can be a silicon capacitor. Capacitor 160 can be disposed between the first and second semiconductor dies 120, 130, in die gap 138. In some examples, an array of bridge contact pads can be disposed on the first and second surfaces of bridge substrate 151, first semiconductor die 120, second semiconductor die 130, third semiconductor die 140 or combinations thereof. The capacitor 160 can be coupled to the first and second semiconductor dies 120, 130 through the array of bridge contact pads disposed on the first surface of bridge substrate 151, and micro bumps 156. The capacitor 160 can be coupled to the third semiconductor die 140 through the array of bridge contact pads disposed on the second surface of bridge substrate 151, and micro bumps 154.

Bridge component 150 can include via such as laminated via, through silicon via (TSV), through glass via (TGV), or combinations thereof. In some examples, the bridge component 150 can additionally include an underfill layer on or around micro bumps 154, 156 for mechanical protection of the bridge component 150 and solder bump joints.

Figure 2:
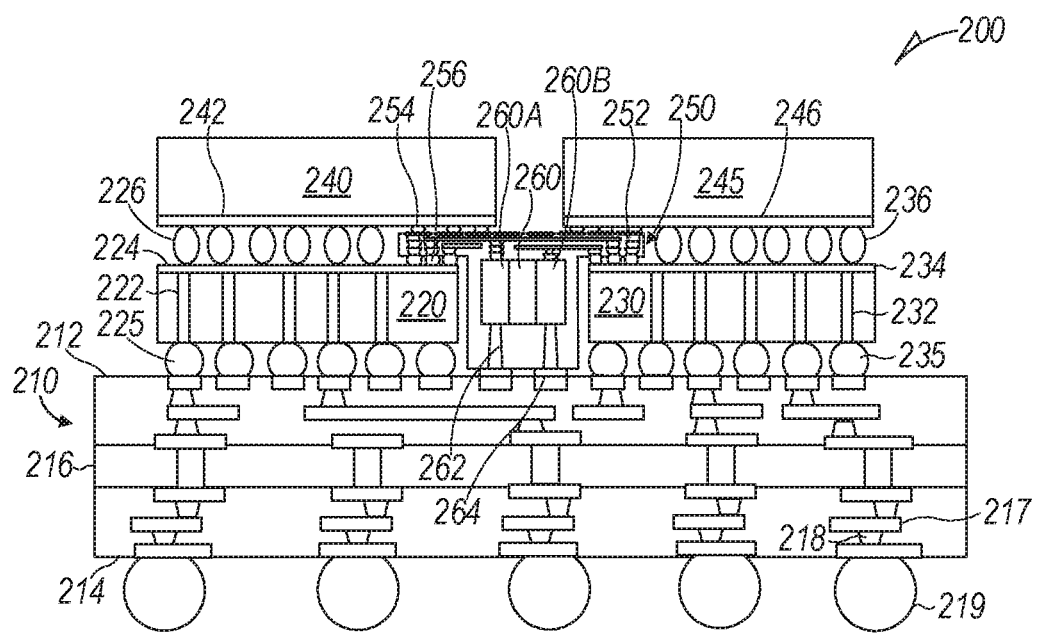
FIG. 2 shows a schematic diagram illustrating an example stacked dies semiconductor package with an overhang bridge component for high bandwidth applications.

FIG. 2 shows a schematic diagram illustrating an example stacked dies semiconductor package 200 with an overhang bridge component for high bandwidth applications. The components of package 200 are similar to the corresponding components in package 100, except where otherwise noted.

Package 200 can include package substrate 210, with first surface 212, second surface 214, core layer 216, trace 217, via 218, and solder balls 219; first semiconductor die 220 with via 222, active layer 224, and solder bumps 225, 226;

second semiconductor die 230 with via 232, active layer 234, and solder bumps 235, 236; die gap 238; third semiconductor die 240 with active layer 242; fourth semiconductor die 245 with active layer 246, bridge component 250 with interconnects 252 and micro bumps 254, 256, and capacitor 260.

In package 200, package substrate 210 host and supports semiconductor dies 220, 230, 240, 245. Semiconductor dies 220, 230, 240, 245, are electrically coupled to each other and other components on or connected to package substrate 210 through bridge component 250. Third semiconductor die 240 and fourth semiconductor die 245 can be stacked on top of first and second semiconductor dies 220, 230, through support of bridge component 250. In some examples, third semiconductor die 240 has a footprint larger than the first semiconductor die 220. In some examples, fourth semiconductor die 245 has a footprint larger than the second semiconductor die 230. Capacitor 260 resides on and is coupled to bridge component 250.

In package 200, third semiconductor dies 240 can be, for example, a logic processor chip. Fourth semiconductor die 245 can be, for example, a second logic processor chip, or a memory die. Third and fourth semiconductor die 240, 245, can be, for example, vertically stacked on first and second semiconductor dies 220, 230, which can be, for example, a platform controller hub (PCH).

Capacitor 260 can be, for example, coupled to all four semiconductor die 220, 230, 240, 245, through bridge component 250. Capacitor 260 can be, for example, coupled to package substrate 210, in addition to other components on the circuit board (not pictured) through, for example, land side via 262. Land side via 262 can, for example, coupled first and second terminals 260A, 260B of capacitor 260 to contact pads on package substrate 210 through solder interconnect 264. First and second terminals 260A, 260B of capacitor 260 can be, for example, associated with reference planes such as a ground reference plane ($V_{ss}$) or a power reference plane ($V_{CC}$). In some examples, capacitor 260 can be a different type of passive component coupled to bridge component 250.

Figure 3B:
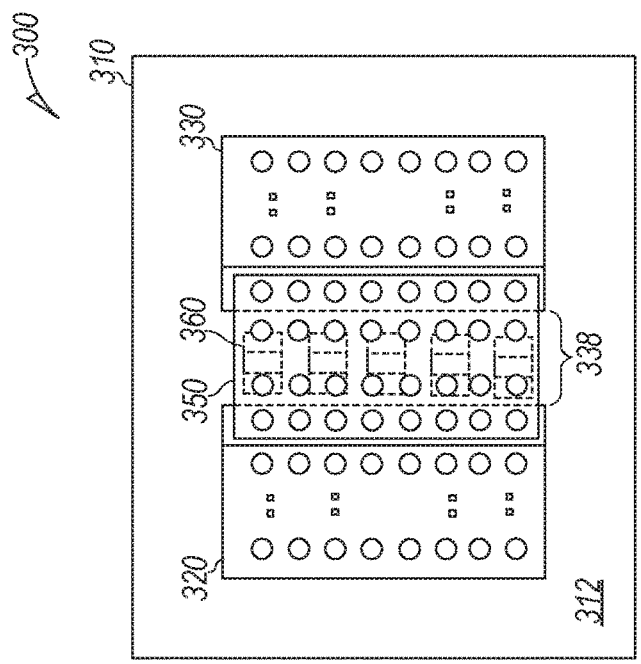
FIGS. 3A-3B show schematic diagrams illustrating an example stacked semiconductor die package with an overhang bridge component for a low profile configuration.
Figure 3A:
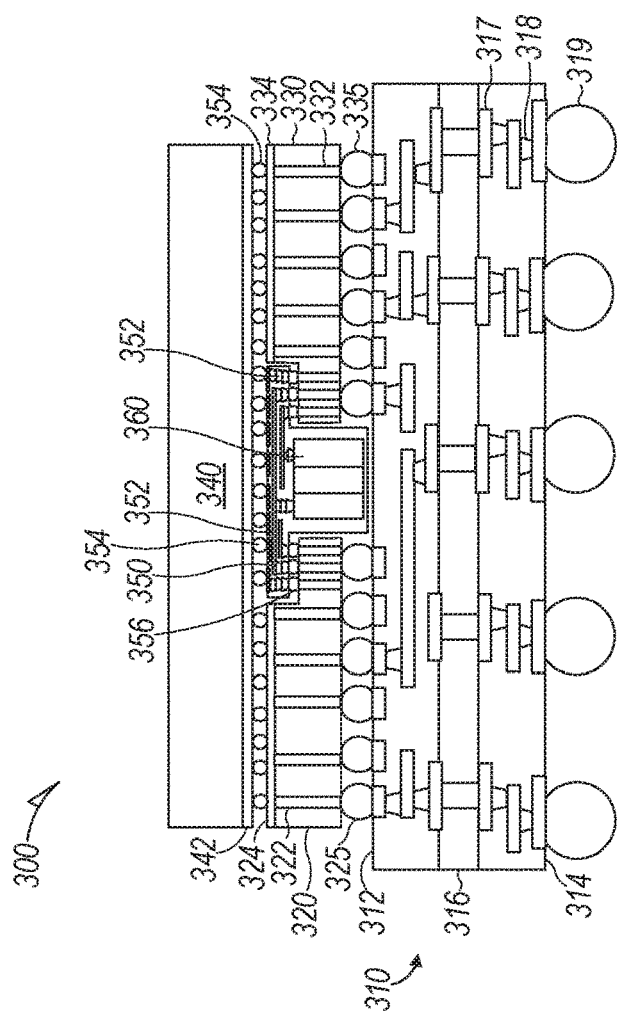

FIGS. 3A-3B show schematic diagrams illustrating an example semiconductor package 300 having stacked dies with an overhang bridge component for a low profile configuration. FIG. 3A shows a cross-sectional schematic view of package 300, while FIG. 3B shows a top-down schematic view of package 300. The components of package 300 are similar to the corresponding components in package 100, except where otherwise noted.

Package 300 can include package substrate 310, with first surface 312, second surface 314, core layer 316, trace 317, via 318, and solder balls 319; first semiconductor die 320 with via 322, active layer 324, and solder bumps 325; second semiconductor die 330 with via 332, active layer 334, and solder bumps 335; die gap 338; third semiconductor die 340 with active layer 342; bridge component 350 with interconnects 352; micro bumps 354, and capacitor 360.

In package 300, package substrate 310 host and supports semiconductor dies 320, 330, 340. Semiconductor dies 320, 330, 340, are electrically coupled to each other and other components on or connected to package substrate 310 through bridge component 350. Third semiconductor die 340 can be stacked on top of first and second semiconductor dies 320, 330, through support of bridge component 350. Capacitor 360 resides on and is coupled to bridge component 350.

In package 300, first and second semiconductor die 320, 330, can each have a recess or ledge near bridge component 350. The recesses can together frame a cavity space where the bridge component 350 can reside. The recesses can allow for bridge component 350 to fit in between first, second, and third semiconductor die 320, 330, 340.

This configuration can, for example, reduce the z-height profile of the package 300. Additionally, the pitch of via, such as through silicon via (TSV), can be reduced, as the thickness of semiconductor die 320, 330, are reduced near the recesses. This can allow, for example, for higher die-to-die interconnect density between first semiconductor die 320 and second semiconductor die 330. Additionally, micro bumps 354 can be of uniform size along the surface of third semiconductor die 340.

FIGS. 4A-4B show schematic diagrams illustrating an example stacked dies semiconductor package 400 with an overhang bridge component in an antenna configuration. FIG. 4A shows a top-down view of package 400, while FIG. 4B shows a cross-section view of package 400. The components of package 400 are similar to the corresponding components in package 100, except where otherwise noted.

Package 400 can include package substrate 410, with first surface 412, second surface 414, core layer 416, trace 417, via 418, and solder balls 419; first semiconductor die 420 with via 422, active layer 424, and solder bumps 425; second semiconductor die 430 with via 432, active layer 434, and solder bumps 435; third semiconductor die 440, fourth semiconductor die 445; bridge component 450 with interconnects 452, micro bumps 454, and silicon ledge 456, conductive traces 457, 458, capacitor 460, and antenna array 470.

In package 400, package substrate 410 host and supports semiconductor dies 420, 430, 440, 445. Semiconductor dies 420, 430, 440, 445, are electrically coupled to each other and other components on or connected to package substrate 410 through bridge component 450. Capacitor 460 resides on and is coupled to bridge component 450.

Package 400 is a multi-chip package (MCP) with heterogenous device integration. Semiconductor die 420, 430, 440, 445, can be disposed on package substrate 410 surface 412. First semiconductor die 420 can be, for example, a logic processor, second semiconductor die 430 can be, for example, a radio frequency integrated circuit (RFIC); third semiconductor die 440 can be, for example, a platform controller hub; and fourth semiconductor die 445 can be, for example, a memory device.

In package 400, semiconductor die 420, 430, 440, 445, can each have ledges 456 or recesses forming a cavity where bridge component 450 resides. Bridge component 450 can include a conductive redistribution layer including conductive traces 457, 458, to couple semiconductor die 420, 430, 440, 445, to each other, to package 410, to other components, or to combinations thereof.

The conductive redistribution layer in bridge component 450 can include, for example, first conductive trace 457 in a first direction and second conductive trace 458 in a second direction. The first direction can be, for example, orthogonal to the second direction. The conductive traces 457, 458, can be, for example, disposed in silicon ledge 456. In some examples, conductive traces 457, 458 can reside in separate conductive layers isolated by one or more dielectric layers.

First semiconductor die 420 can be coupled to second semiconductor die 430 through first conductive trace 457, while third semiconductor die 440 can be coupled to fourth semiconductor die 445 through second conductive trace 458. Capacitor 460 can be, for example, coupled to all four semiconductor die 420, 430, 440, 445, through bridge component 450.

Antenna array 470 can include a plurality of phase antenna array for wireless data communication. The antenna array 470 can be disposed on the second surface of bridge component 450 opposite capacitor 460. The antenna array 470 can be, for example, coupled to the active surface of second semiconductor die 430 through one or more via (such as TSV) or conductive traces. In some examples, semiconductor dies 420, 430, 440, 445, are covered with a shield layer (not pictured) to prevent radio frequency interference from the wireless data communication.

Figure 5:
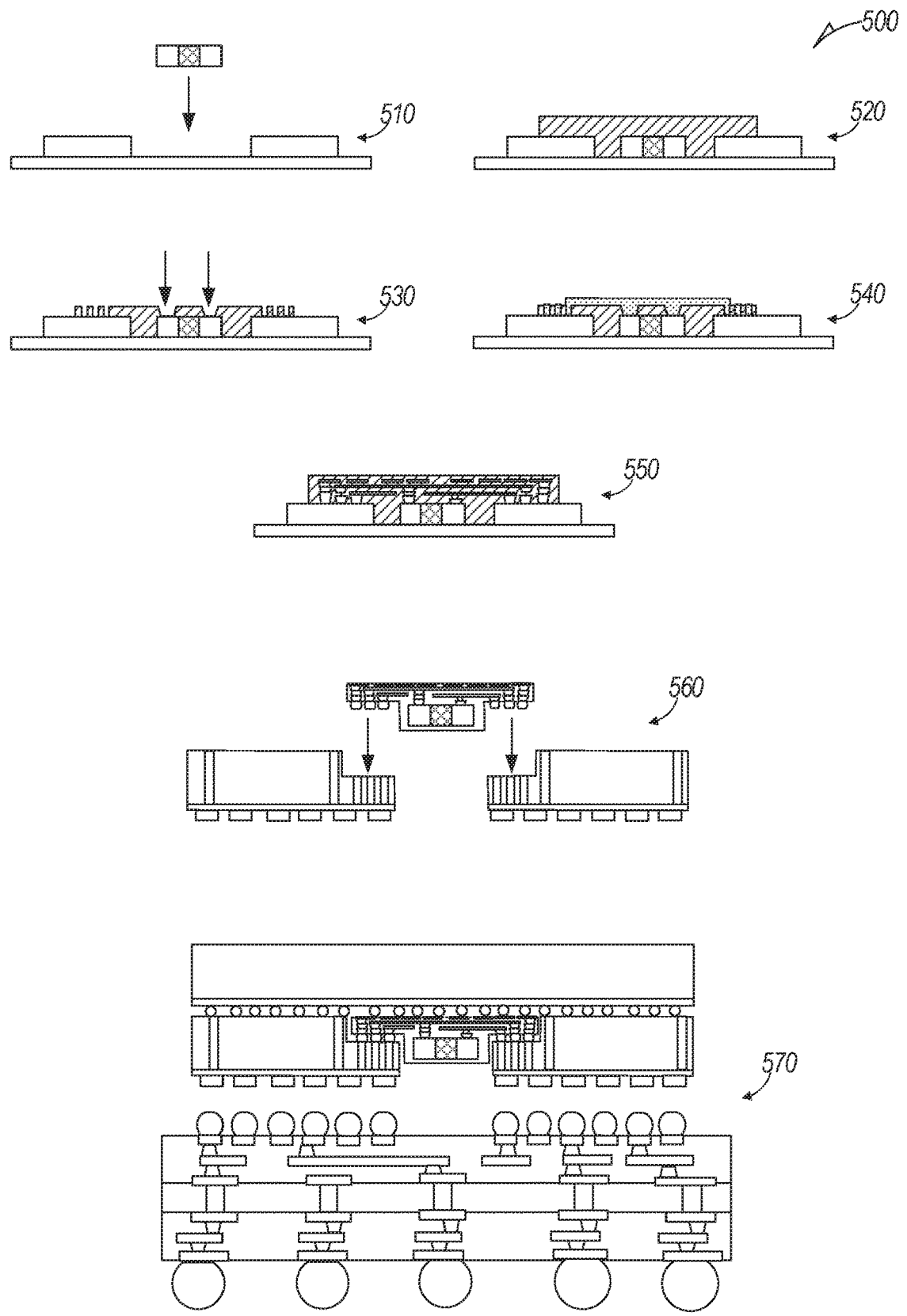
FIG. 5 is a schematic diagram showing a method of making an example stacked semiconductor die package with an overhang bridge component.

FIG. 5 is a schematic diagram showing a method 500 of making an example semiconductor package having stacked dies with an overhang bridge component.

First, in step 510, a passive component, such as a decoupling capacitor, can be attached to a carrier material with a dry film resist layer. Portions of the dry film resist layer can be removed to allow for attachment of the passive component.

Next, in step 520, a mold layer can be made over the passive component and the dry film resist layer. The mold layer can be made, for example, by an injection or compression molding process.

Subsequently, in step 530, mold openings can be formed for conductive routing. The mold openings can be formed, for example, by a laser or mechanical drilling process. In step 540, conductive routing, traces, and via can be formed in the mold openings, such as, for example, by an electroplating and etching process.

In step 550, the bridge component routing layers can be formed by building up the mold and conductive traces. For example, this can be done by electroplating and etching. The bridge component can then be released from the carrier material and the dry film resist layer, for example, by an etching process.

Next, in step 560, the bridge component can be attached to semiconductor dies. This can be done, for example, by solder bump attachment, such as by a reflow process.

Subsequently, in step 570, the package can be assembled by attaching subsequent semiconductor dies, and attaching the dies with the bridge component to the package substrate. This can be done, for example, with solder bumps and by a reflow process.

Figure 6:
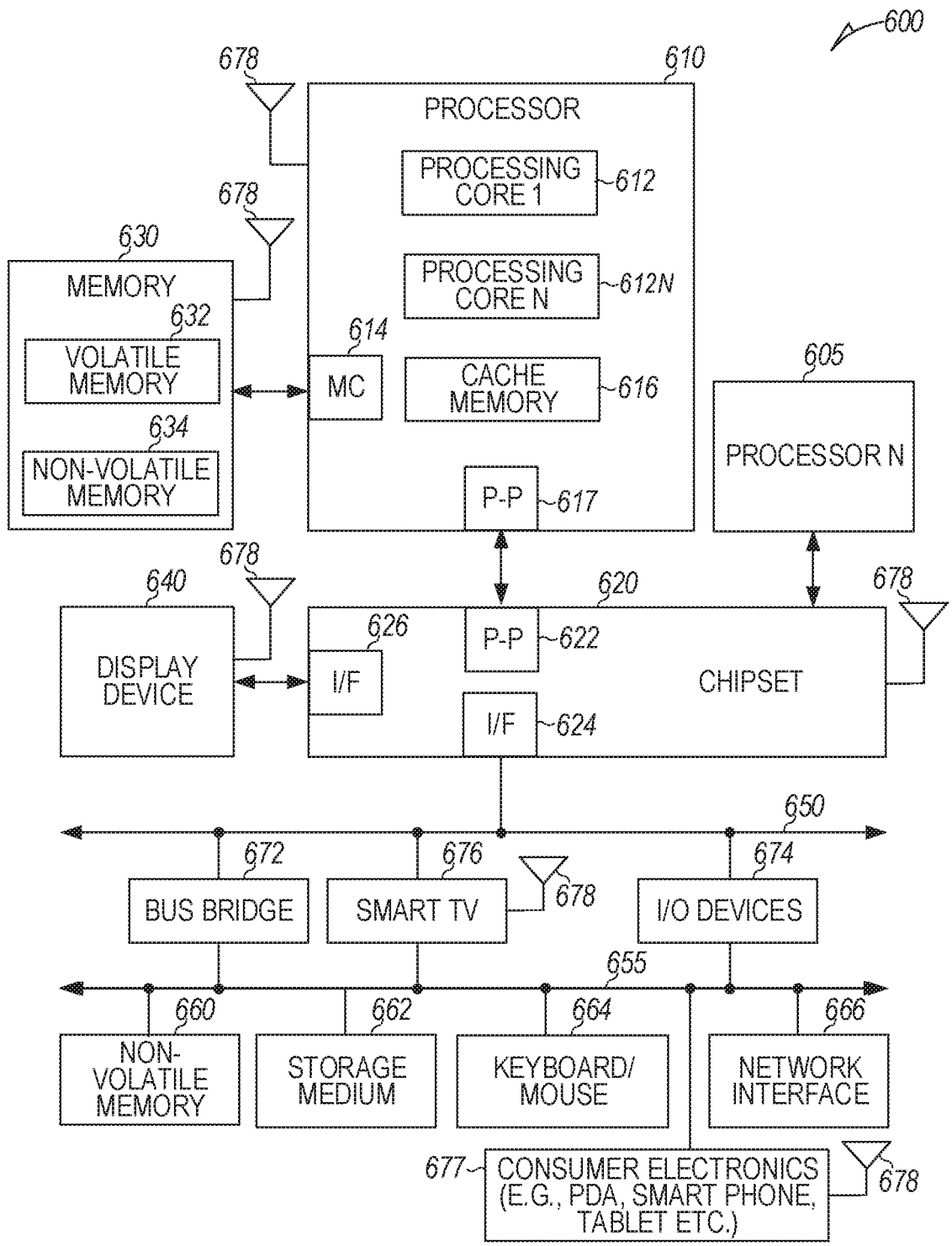
FIG. 6 shows a system that may incorporate an example stacked semiconductor die package with an overhang bridge component and methods, in accordance with some example embodiments.

FIG. 6 illustrates a system level diagram, depicting an example of an electronic device (e.g., system) that may include an example stacked semiconductor package with an overhang bridge component and/or methods described above. In one embodiment, system 600 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 600 includes a system on a chip (SOC) system.

In one embodiment, processor 610 has one or more processor cores 612 and 612N, where 612N represents the Nth processor core inside processor 610 where N is a positive integer. In one embodiment, system 600 includes multiple processors including 610 and 605, where processor 605 has logic similar or identical to the logic of processor 610. In some embodiments, processing core 612 includes, but is not limited to, pre-fetch logic to fetch instructions, decode logic to decode the instructions, execution logic to execute instructions and the like. In some embodiments, processor 610 has a cache memory 616 to cache instructions and/or data for system 600. Cache memory 616 may be organized into a hierarchal structure including one or more levels of cache memory.

In some embodiments, processor 610 includes a memory controller 614, which is operable to perform functions that enable the processor 610 to access and communicate with memory 630 that includes a volatile memory 632 and/or a non-volatile memory 634. In some embodiments, processor 610 is coupled with memory 630 and chipset 620. Processor 610 may also be coupled to a wireless antenna 678 to communicate with any device configured to transmit and/or receive wireless signals. In one embodiment, an interface for wireless antenna 678 operates in accordance with, but is not limited to, the IEEE 802.11 standard and its related family, Home Plug AV (HPAV), Ultra-Wide Band (UWB), Bluetooth, WiMAX or any form of wireless communication protocol.

In some embodiments, volatile memory 632 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 634 includes, but is not limited to, flash memory, phase change memory (PCM), read-only memory (ROM), electrically erasable programmable read-only memory (EEPROM), or any other type of non-volatile memory device.

Memory 630 stores information and instructions to be executed by processor 610. In one embodiment, memory 630 may also store temporary variables or other intermediate information while processor 610 is executing instructions. In the illustrated embodiment, chipset 620 connects with processor 610 via Point-to-Point (PtP or P-P) interfaces 617 and 622. Chipset 620 enables processor 610 to connect to other elements in system 600. In some embodiments of the example system, interfaces 617 and 622 operate in accordance with a PtP communication protocol such as the Intel® Quick Path Interconnect (QPI) or the like. In other embodiments, a different interconnect may be used.

In some embodiments, chipset 620 is operable to communicate with processor 610, 605N, display device 640, and other devices, including a bus bridge 672, a smart TV 676, I/O devices 674, non-volatile memory 660, a storage medium (such as one or more mass storage devices) 662, a keyboard/mouse 664, a network interface 666, and various forms of consumer electronics 677 (such as a PDA, smart phone, tablet etc.), etc. In one embodiment, chipset 620 couples with these devices through an interface 624. Chipset 620 may also be coupled to a wireless antenna 678 to communicate with any device configured to transmit and/or receive wireless signals.

Chipset 620 connects to display device 640 via interface 626. Display 640 may be, for example, a liquid crystal display (LCD), a light emitting diode (LED) array, an organic light emitting diode (OLED) array, or any other form of visual display device. In some embodiments of the example system, processor 610 and chipset 620 are merged into a single SOC. In addition, chipset 620 connects to one or more buses 650 and 655 that interconnect various system elements, such as I/O devices 674, non-volatile memory 660, storage medium 662, a keyboard/mouse 664, and network interface 666. Buses 650 and 655 may be interconnected together via a bus bridge 672.

In one embodiment, mass storage device 662 includes, but is not limited to, a solid state drive, a hard disk drive, a universal serial bus flash memory drive, or any other form of computer data storage medium. In one embodiment, network interface 666 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra-Wide Band (UWB), Bluetooth, WiMAX, or any form of wireless communication protocol.

While the modules shown in FIG. 6 are depicted as separate blocks within the system 600, the functions performed by some of these blocks may be integrated within a single semiconductor circuit or may be implemented using two or more separate integrated circuits. For example, although cache memory 616 is depicted as a separate block within processor 610, cache memory 616 (or selected aspects of 616) can be incorporated into processor core 612.

To better illustrate the method and apparatuses disclosed herein, a non-limiting list of embodiments is provided here:

Example 1 can include a semiconductor article comprising: a package substrate; a first semiconductor die coupled to the package substrate; a second semiconductor die coupled to the package substrate and adjacent the first semiconductor die; and a bridge component therebetween coupling the first semiconductor die to the second semiconductor die. The bridge component comprising: a bridge substrate; a conductive layer therein; and a passive component coupled to the conductive layer.

Example 2 can include Example 1, wherein the bridge component further comprises a plurality of contact pads on the bridge substrate, a portion of the plurality of contact pads coupled to the passive component through the conductive layer.

Example 3 can include any of Examples 1-2, wherein the conductive layer further comprises at least one ground plane and at least one power plane.

Example 4 can include any of Examples 1-3, wherein the at least one ground plane and the at least one power plane are coupled to the passive component.

Example 5 can include any of Examples 1-4, wherein the passive component comprises a capacitor.

Example 6 can include any of Examples 1-5, wherein the passive component is at least partially embedded in the bridge substrate.

Example 7 can include any of Examples 1-6, wherein the passive component mounted on the bridge substrate between the first semiconductor die and the second semiconductor die.

Example 8 can include any of Examples 1-7, wherein the bridge component is coupled to the package substrate.

Example 9 can include any of Examples 1-8, further comprising a third semiconductor die coupled to the first semiconductor die, the second semiconductor die, and the bridge component, opposite the package substrate.

Example 10 can include any of Examples 1-9, further comprising: a first plurality of solder balls coupling the first semiconductor die to the third semiconductor die; a second plurality of solder balls coupling the second semiconductor die to the third semiconductor die; and a third plurality of solder balls coupling the bridge component to the third semiconductor die, wherein some of the third plurality of solder balls have a diameter less than the diameters of some of the first and second pluralities of solder balls.

Example 11 can include any of Examples 1-10, wherein the first semiconductor die comprises a first recess, the second semiconductor die comprises a second recess, and wherein the bridge component extends from the first recess to the second recess.

Example 12 can include any of Examples 1-11, further comprising a third semiconductor die and a fourth semiconductor die, coupled to the first semiconductor die, the second semiconductor die, and the package substrate by the bridge component.

Example 13 can include any of Examples 1-12, wherein the third semiconductor die and the fourth semiconductor die are orthogonal to the first semiconductor die and the second semiconductor die.

Example 14 can include any of Examples 1-13, wherein the package substrate comprises via coupled to the first and second semiconductor dies.

Example 15 can include a bridge component comprising: a bridge substrate; a conductive layer comprising a conductive trace therein; a passive component coupled to the bridge substrate; and first and second contact pads on the bridge substrate, the first and second contact pads coupled to the passive component through the conductive trace.

Example 16 can include Example 15, wherein the bridge substrate comprises a first surface and an opposing second surface, wherein the passive component is coupled to the first surface of the bridge substrate, the first and second contact pads are on the first surface of the bridge substrate, and further comprising a plurality of conductive structures coupled to the second surface, the first and second contact pads.

Example 17 can include Example 15, further comprising third and fourth contact pads coupled to the conductive trace.

Example 18 can include any of Examples 15-16, wherein the first and second contact pads are coupled to the conductive trace in a first direction, and the third and fourth contact pads are coupled to the conductive trace in a second direction orthogonal the first direction.

Example 19 can include an electronic device comprising a semiconductor package and an antenna component coupled to the plurality of contact pads. The semiconductor package can include a package substrate; a first semiconductor die coupled to the package substrate; a second semiconductor die coupled to the package substrate and adjacent the first semiconductor die; and a bridge component therebetween coupling the first semiconductor die to the second semiconductor die. The bridge component can include a bridge substrate; a conductive trace therein; a passive component coupled to the conductive trace; and a plurality of contact pads on the bridge substrate, the plurality of contact pads coupled to the passive component through the conductive trace.

Example 20 can include Example 19, wherein the semiconductor package further comprises a third semiconductor die, and a fourth semiconductor die.

Example 21 can include any of Examples 19-20, wherein the bridge component further comprises a second conductive trace.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Although an overview of the inventive subject matter has been described with reference to specific example embodiments, various modifications and changes may be made to these embodiments without departing from the broader scope of embodiments of the present disclosure. Such embodiments of the inventive subject matter may be referred to herein, individually or collectively, by the term "invention" merely for convenience and without intending to voluntarily limit the scope of this application to any single disclosure or inventive concept if more than one is, in fact, disclosed.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The Detailed Description, therefore, is not to be taken in a limiting sense, and the scope of various embodiments is defined only by the appended claims, along with the full range of equivalents to which such claims are entitled.

As used herein, the term "or" may be construed in either an inclusive or exclusive sense. Moreover, plural instances may be provided for resources, operations, or structures described herein as a single instance. Additionally, boundaries between various resources, operations, modules, engines, and data stores are somewhat arbitrary, and particular operations are illustrated in a context of specific illustrative configurations. Other allocations of functionality are envisioned and may fall within a scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

The foregoing description, for the purpose of explanation, has been described with reference to specific example embodiments. However, the illustrative discussions above are not intended to be exhaustive or to limit the possible example embodiments to the precise forms disclosed. Many modifications and variations are possible in view of the above teachings. The example embodiments were chosen and described in order to best explain the principles involved and their practical applications, to thereby enable others skilled in the art to best utilize the various example embodiments with various modifications as are suited to the particular use contemplated.

It will also be understood that, although the terms "first," "second," and so forth may be used herein to describe various elements, these elements should not be limited by these terms. These terms are only used to distinguish one element from another. For example, a first contact could be termed a second contact, and, similarly, a second contact could be termed a first contact, without departing from the scope of the present example embodiments. The first contact and the second contact are both contacts, but they are not the same contact.

The terminology used in the description of the example embodiments herein is for the purpose of describing particular example embodiments only and is not intended to be limiting. As used in the description of the example embodiments and the appended examples, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in response to detecting." depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]." depending on the context.

The invention claimed is:

1. A semiconductor article comprising:
   a package substrate;
   a first semiconductor die coupled to the package substrate;
   a second semiconductor die coupled to the package substrate and adjacent the first semiconductor die; and
   a bridge component therebetween coupling the first semiconductor die to the second semiconductor die, the bridge component comprising:
      a bridge substrate;
      a conductive layer therein; and
      a capacitor coupled to the conductive layer, the capacitor physically between the first semiconductor die and the second semiconductor die.

2. The article of claim 1, wherein the bridge component further comprises a plurality of contact pads on the bridge substrate, a portion of the plurality of contact pads coupled to the capacitor through the conductive layer.

3. The article of claim 1, wherein the conductive layer further comprises at least one ground plane and at least one power plane.

4. The article of claim 3, wherein the at least one ground plane and the at least one power plane are coupled to the capacitor.

5. The article of claim 1, wherein the passive component is at least partially embedded in the bridge substrate.

6. The article of claim 1, wherein the bridge component is coupled to the package substrate.

7. The article of claim 1, further comprising a third semiconductor die coupled to the first semiconductor die, the second semiconductor die, and the bridge component, opposite the package substrate.

8. The article of claim 7, further comprising:
   a first plurality of solder balls coupling the first semiconductor die to the third semiconductor die;
   a second plurality of solder balls coupling the second semiconductor die to the third semiconductor die; and
   a third plurality of solder balls coupling the bridge component to the third semiconductor die, wherein some of the third plurality of solder balls have a diameter less than the diameters of some of the first and second pluralities of solder balls.

9. The article of claim 1, further comprising a third semiconductor die and a fourth semiconductor die, coupled to the first semiconductor die, the second semiconductor die, and the package substrate by the bridge component.

10. The article of claim 9, wherein the third semiconductor die and the fourth semiconductor die are orthogonal to the first semiconductor die and the second semiconductor die.

11. The article of claim 1, wherein the package substrate comprises via coupled to the first and second semiconductor dies.

12. A semiconductor article comprising:
a package substrate;
a first semiconductor die coupled to the package substrate;
a second semiconductor die coupled to the package substrate and adjacent the first semiconductor die;
a bridge component therebetween coupling the first semiconductor die to the second semiconductor die, the bridge component comprising:
  a bridge substrate;
  a conductive layer therein; and
  a passive component coupled to the conductive layer; and
a third semiconductor die coupled to the first semiconductor die, the second semiconductor die, and the bridge component, opposite the package substrate,
wherein the first semiconductor die comprises a first recess, the second semiconductor die comprises a second recess, and wherein the bridge component extends from the first recess to the second recess.

13. A bridge component comprising:
a bridge substrate comprising a first surface and an opposing second surface;
a conductive layer comprising a conductive trace therein;
a passive component coupled to the first surface of the bridge substrate;
first and second contact pads on the first surface of the bridge substrate, at least a portion of the first and second contact pads coupled to the passive component through the conductive trace; and
a plurality of conductive structures onto the second surface of the bridge substrate, the plurality of conductive structures coupled to the first and second contact pads.

14. The bridge component of claim 13, further comprising third and fourth contact pads coupled to the conductive trace.

15. The bridge component of claim 13, wherein the first and second contact pads are coupled to the conductive trace in a first direction, and the third and fourth contact pads are coupled to the conductive trace in a second direction orthogonal the first direction.

16. An electronic device comprising:
a semiconductor package comprising:
  a package substrate;
  a first semiconductor die coupled to the package substrate;
  a second semiconductor die coupled to the package substrate and adjacent the first semiconductor die; and
  a bridge component therebetween coupling the first semiconductor die to the second semiconductor die, the bridge component comprising:
    a bridge substrate;
    a conductive trace therein; and
    a capacitor coupled to the conductive layer;
    a plurality of contact pads on the bridge substrate, the plurality of contact pads coupled to the capacitor through the conductive trace; and
an antenna component coupled to the plurality of contact pads.

17. The device of claim 16, wherein the semiconductor package further comprises a third semiconductor die, and a fourth semiconductor die.

\* \* \* \* \*

UNITED STATES PATENT AND TRADEMARK OFFICE
CERTIFICATE OF CORRECTION

PATENT NO. : 11,430,764 B2
APPLICATION NO. : 17/024056
DATED : August 30, 2022
INVENTOR(S) : Cheah et al.

It is certified that error appears in the above-identified patent and that said Letters Patent is hereby corrected as shown below:

In the Claims

In Column 14, Line 13, in Claim 15, after "orthogonal", insert --to--

Signed and Sealed this
Thirteenth Day of June, 2023

Katherine Kelly Vidal
*Director of the United States Patent and Trademark Office*